US010560070B2

(12) United States Patent
Gramegna

(10) Patent No.: US 10,560,070 B2
(45) Date of Patent: Feb. 11, 2020

(54) FILTER CIRCUIT WITH PROGRAMMABLE GAIN AND FREQUENCY RESPONSE

(71) Applicant: Huawei Technologies Co., Ltd., Shenzhen (CN)

(72) Inventor: Giuseppe Gramegna, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/260,996

(22) Filed: Jan. 29, 2019

(65) Prior Publication Data

US 2019/0158067 A1    May 23, 2019

Related U.S. Application Data

(63) Continuation of application No. PCT/EP2016/071688, filed on Sep. 14, 2016.

(51) Int. Cl.
*H03K 5/00* (2006.01)
*H03H 11/12* (2006.01)
*H03F 3/45* (2006.01)
*H03F 3/72* (2006.01)

(52) U.S. Cl.
CPC ..... *H03H 11/1286* (2013.01); *H03F 3/45197* (2013.01); *H03F 3/72* (2013.01); *H03H 11/12* (2013.01); *H03H 11/126* (2013.01); *H03H 11/1291* (2013.01); *H03H 2210/012* (2013.01); *H03H 2210/017* (2013.01)

(58) Field of Classification Search
CPC .. H03H 11/1286; H03H 11/12; H03H 11/126; H03H 11/1291; H03H 2210/012; H03H 2210/017; H03F 3/72
See application file for complete search history.

(56) References Cited

U.S. PATENT DOCUMENTS

| 8,441,313 B2 * | 5/2013 | Shih ..................... H04L 25/0278 |
| | | 327/552 |
| 8,482,343 B1 | 7/2013 | Alzaher |
| 9,264,028 B2 * | 2/2016 | Cousinard ............ G01R 19/175 |
| 2003/0095005 A1 | 5/2003 | Morie et al. |
| 2003/0181176 A1 | 9/2003 | Darabi |

(Continued)

FOREIGN PATENT DOCUMENTS

| EP | 1811662 A1 | 7/2007 |
| WO | 0159925 A1 | 8/2001 |

OTHER PUBLICATIONS

El-Adawy, A., et al., "Low Voltage Low Power Fully Differential CMOS Current Mode Digitally Controlled Variable Gain Amplifier," XP001124161, vol. 56, No. 7/08, Jul. 1, 2002, pp. 170-176.

(Continued)

*Primary Examiner* — Dinh T Le

(74) *Attorney, Agent, or Firm* — Conley Rose, P.C.

(57) ABSTRACT

A filter circuit includes a filter and a current mode programmable gain amplifier, where the filter circuit is configured to filter an input signal to obtain an output signal. The filter is supplied with the input signal. The filter comprises at least one current extraction element configured to extract a first output current signal. The current mode programmable gain amplifier is configured to receive and amplify the first output current signal to obtain an amplified current signal. The output signal is derived from the amplified current signal.

20 Claims, 11 Drawing Sheets

(56) References Cited

U.S. PATENT DOCUMENTS

2005/0040891 A1 2/2005 Sobel
2010/0066442 A1 3/2010 Mu
2014/0312964 A1 10/2014 Alzaher

OTHER PUBLICATIONS

Foreign Communication From a Counterpart Application, PCT Application No. PCT/EP2016/071688, English Translation of International Search Report dated May 26, 2017, 6 pages.
Foreign Communication From a Counterpart Application, PCT Application No. PCT/EP2016/071688, English Translation of Written Opinion dated May 26, 2017, 9 pages.

* cited by examiner

FILTER CIRCUIT WITH PROGRAMMABLE GAIN AND FREQUENCY RESPONSE

CROSS-REFERENCE TO RELATED APPLICATIONS

This application is a continuation of International Patent Application No. PCT/EP2016/071688 filed on Sep. 14, 2016, which is hereby incorporated by reference in its entirety.

TECHNICAL FIELD

The disclosure relates to a filter for filtering high frequency signals, especially communications signals.

BACKGROUND

A typical scheme for a wireless communications in the RX section is shown in FIG. 1. The circuit 1 comprises a mixer 10, which is connected to two processing paths 16a, 16b. Both processing paths 16a, 16b each comprise an input processing network 11a, 11b, connected to a programmable gain amplifier (also referred to as PGA) 12a, 12b, which in turn is connected to a low-pass filter 13a, 13b. The low-pass filters 13a, 13b are each connected to a variable gain amplifier 14a, 14b, which in turn is connected to a driver 15a, 15b.

A differential input signal INP, INN is entered into the mixer 10 and mixed with a local oscillator signal LO_I, LO_Q, resulting in an intermediate frequency signal. An I-component is handled by the first processing path 16a, while a Q-component is handled by the second processing path 16b. The input networks 11a, 11b perform a matching and hand the signal on to the programmable gain amplifiers 12a, 12b, which perform an attenuation. The low-pass filters 13a, 13b perform a low-pass filtering, before the variable gain amplifiers 14a, 14b perform a variable gain amplification. Finally, the drivers 15a, 15b perform an additional fixed gain amplification.

In such systems, the low pass filter 13a, 13b selects the useful signal. This is often used to tune the operation frequency of the filter and the gain of the receiving (RX) Section. The gain is usually programmed with the programmable gain amplifier 12a, 12b.

The filters 13a, 13b can be used also in other applications. When high linearity is needed, closed loop approaches are preferred over, Gm-C implementations. RC filters fall into three categories, Sallen-Key, BiQuad, Multiple-Feedback (MFB) each one with distinct advantages and disadvantages. Their architecture and design equations are shown in the following.

In FIG. 2, an exemplary BiQuad filter 20 is shown. The filter 20 comprises an input resistor 21, which is connected to a negative input of a first operational amplifier 24. The positive input of the operational amplifier 24 is connected to ground. The output of the first operational amplifier 24 is connected to the negative input of the first operational amplifier 24 by a parallel connection of a resistor 22 and a capacitor 23. The output of the first operational amplifier 24 is moreover connected by a resistor 26 to a negative input of a second operational amplifier 28. The positive input of the second operational amplifier 28 is connected to ground. The negative input of the second operational amplifier is connected to the output of the second operational amplifier 28 by a capacitor 27. The output of the second operational amplifier 28 is moreover connected to an inverter 29, which in turn is connected to a resistor 25, which again is connected to the negative input of the first operational amplifier 24. The resistor 21 forms the input port of the BiQuad filter 20, while the output of the second operational amplifier 28 forms the output of the BiQuad filter. The equations, in particular transfer function, operating frequency and quality factor, of the BiQuad filter are given by:

$$H(s) = \frac{-R_4/R_1}{1+s/(Q\omega_0)+(s/\omega_0)^2},$$

$$\omega_o = \frac{1}{\sqrt{C_1 C_2 R_2 R_4}}, \text{ and}$$

$$Q = \sqrt{\frac{C_1}{C_2}} \frac{R_3}{\sqrt{R_2 R_4}}.$$

In FIG. 3, a Sallen-Key filter is shown. The Sallen-Key filter 30 comprises a resistor 31, which is connected to a resistor 32, which again is connected to a positive input of an operational amplifier 36. The positive input of the operational amplifier 36 is moreover connected to ground by a capacitor 34. The connection point between the resistors 31 and 32 is moreover connected by a capacitor 33 to the output of the operational amplifier 36. The output of the operational amplifier 36 is moreover connected by a resistor 37 to the negative input of the operational amplifier. The negative input of the operational amplifier 36 is moreover connected to ground by a resistor 35. The resistor 31 forms the input of the Sallen-Key filter 30, while he output of the operational amplifier 36 forms the output of the Sallen-Key filter 30. The equations of the Sallen-key filter are given as follows:

$$R_1 = \alpha R$$
$$R_2 = R$$
$$C_2 = C$$
$$C_1 = \beta C$$
$$G = 1 + R_6/R_5$$
$$H(s) = \frac{G}{1+sC_2(R_2+R_1)+R_1C_1(1-G)+s^2 C_1 C_2 R_2 R_1}$$
$$Q = \frac{\sqrt{\alpha\beta}}{1+\alpha+\alpha\beta(1-G)}$$
$$\omega_0 = \frac{1}{RC\sqrt{\alpha\beta}}$$

In FIG. 4, a MFB filter 40 is shown. The MFB filter comprises a resistor 41, which is connected to a resistor 43, which in turn is connected to a negative input of an operational amplifier 46. The connection point between the resistors 41 and 43 is connected to ground through a capacitor 42 and to an output of the operational amplifier 46 through a resistor 44. The negative input of the operational amplifier 46 is moreover connected to the output of the operational amplifier by a capacitor 45. A positive input of the operational amplifier 46 is connected to ground. The first resistor 41 forms the input port of the MFB filter 40, while the output of the operational amplifier 46 forms the output of the MFB filter 40. The equations of the MFB filter are given in the following:

$$Q = \sqrt{\frac{C_2}{C_1}} \frac{\sqrt{R_2 R_3}}{R_2 + R_3\left(1 + \frac{R_2}{R_1}\right)},$$

$$\omega_o = \frac{1}{\sqrt{C_1 C_2 R_3 R_1}}, \text{ and}$$

$$H(s) = \frac{-R_2/R_1}{1 + s/(Q\omega_o) + (s/\omega_o)^2}.$$

From the above shown equations and topologies it can be shown that for a 2nd order section the Sallen-Key filter is not capable of differential mode. Further, it is difficult to implement gain control and frequency tuning.

The BiQuad filter requires two operational amplifiers and therefore consumes a large amount of power.

With the MFB filter is difficult to implement simultaneous gain control and frequency tuning.

This last statement can be understood by referring to earlier elaborations and equations for MFB operating frequency and quality factor, where the operating frequency can be tuned by changing R or C but it is not possible to change the gain of the filer(=ratio R2/R1) without impacting the quality factor Q, i.e. the shape of the filter. Therefore, MFB does NOT support simultaneous frequency and gain control, and if R2/R1 is changed, Q is automatically changed as well.

This disadvantage, i.e. it is not possible to control simultaneously gain and frequency, makes it necessary to use a separate PGA in case a programmable gain control is needed, like in a typical wireless communication system, as shown in the following FIGS. 5 and 6.

In FIG. 5, a filter circuit 50 comprising a programmable gain amplifier 51 and a filter 52 is shown. Therefore, here the programmable gain amplifier 51 is placed before the filter 52. Alternatively, in FIG. 6, a filter circuit 60 comprising a filter 61 and a programmable gain amplifier 62, is shown. Here, the filter 61 is placed before the programmable gain amplifier 62. Both alternatives have the joint disadvantage of the extra programmable gain amplifier 51, 62 drawing extra current and reducing system bandwidth.

In a possible implementation, low-pass filter (also referred to as LPF) and PGA can be implemented with closed loop voltage-mode structures. In this case, a typical wide-bandwidth operational amplifier (OPAMP) is used. Wide bandwidth is given by the single-pole structure, and low output impedance is given by a voltage follower as output stage.

SUMMARY

Accordingly, an object of the present disclosure is to provide a filter circuit, which provides a simultaneous control over the gain and the frequency response while being operable in a wide bandwidth.

The object is solved by the features of claim 1 for the apparatus. The dependent claims contain further developments.

According to a first aspect of the disclosure, a filter circuit, comprising a filter and a current mode programmable gain amplifier, is provided. The filter circuit is configured to filter an input signal, resulting in an output signal. The filter is supplied with the input signal. The filter comprises at least one current extraction element configured to extract a first output current signal. The current mode programmable gain amplifier is configured for receiving and amplifying the first output current signal resulting in an amplified current signal, the output signal is derived from. It is thereby possible to alter the frequency response and the gain independently, without at the same time inadvertently altering the respective other parameter.

According to a first implementation form of the first aspect, the filter circuit is configured to filter the input signal with an adjustable frequency response and the filter comprises at least one adjustable component configured to adjust the frequency response of the filter circuit. An especially simple adjustability of the frequency response is thereby achieved.

According to a further implementation form of the first aspect or the previous implementation form, the filter circuit is configured to filter the input signal with an adjustable gain. The current mode programmable gain amplifier comprises at least one adjustable component configured to adjust the gain of the filter circuit. An especially simple adjustability of the gain is thereby achieved.

According to a further implementation form of the first aspect or the previously described implementation forms, the filter circuit comprises a current-to-voltage converter, configured for converting the amplified current signal into the output signal, wherein the output signal is a voltage mode signal. This allows for a very simple handling of the output signal.

According to a further implementation form of the first aspect or any of the previously described implementation forms, the at least one first current extraction element is configured to extract the first output current signal, the first output current signal being a function of an output voltage signal of the filter. This allows for a very simple construction of the filter circuit.

According to a further implementation form of the first aspect or any of the previously described implementation forms, the filter further comprises a second current extraction element configured to generate a second output current signal, the second output current signal being proportional to an output voltage signal of the filter. This allows for a further increase in efficiency.

According to a further implementation form of the previous implementation form, the current mode programmable gain amplifier is configured to receive the first output current signal and the second output current signal and further comprises a first current mirror element configured to generate a first mirror output current of the first output current signal, the amplitude of the mirror output current being programmable and a second current mirror element configured to generate a second mirror output current signal of the second output current signal, the amplitude of the second mirror output current being programmable. The current mode programmable gain amplifier is configured to add the first and second mirror current output to generate an amplified current signal. This allows for a simple generation of the amplified current signal.

According to a further implementation form of the previous two implementation forms, a proportionality constant is chosen so that a zero in a transfer function of the amplified current signal equals a parasitic pole associated to the current-to-voltage conversion. It is thereby possible to compensate the negative effects of the parasitic pole in the transfer function.

According to a further implementation form of the previous implementation form, the first current extraction element comprises a first current extraction transistor, the second current extraction element comprises a second current extraction transistor. A base of the first current extraction transistor is connected to a base of the second current extraction transistor. An emitter of the second current extraction transistor is connected to a resistive element, the value of the resistive element setting the proportionality constant. It is thereby very easily possible to implement the proportionality constant in the circuit.

According to a further implementation form of the first aspect or any of the previously described implementation forms, the input signal is a differential signal, the first output current signal is a differential signal, and the filter comprises two current extraction transistors, forming a differential current extraction pair configured to extract the first output current signal from the filter. The first amplified current signal therefore is also a differential signal, as well as the output signal. It is thereby possible to handle differential signals by the filter circuit, According to a further implementation form, the first Current mirror element is a first controllable differential transistor pair and the second current mirror element is a second controllable differential transistor pair, the first and the second controllable differential transistor pair being controllable to adjust a gain of the filter circuit and/or the first controllable differential transistor pair and the second controllable differential transistor pair are configured to jointly generate the amplified current signal. This allows for a very simple controllability of the gain.

According to a further implementation form of the previously described implementation forms, the current-to-voltage converter comprises at least one resistor configured to convert the amplified current signal to the output signal. This allows for a very simple implementation of the output converter.

According to a further implementation form of the previously described implementation forms, the amplified current signal and the output signal are differential signals. The current-to-voltage converter comprises a first resistor and a second resistor, each connected to ground. The differential component signals of the amplified current signal are each connected to one of the first resistor and the second resistor. Each of the first resistor and the second resistor converts the respective component of the amplified current signal into a corresponding component of the output signal. This allows for a very simple to implement output converter for differential signals.

According to a further implementation form of the first aspect or any of the previously described implementation forms, the filter is a high-pass filter or a band-pass filter or a low-pass filter and the filter is a Sallen-Key filter or an MFB filter. This allows for an especially simple-to-implement filter construction.

Generally, it has to be noted that all arrangements, devices, elements, units and means and so forth described in the present application could be implemented by software or hardware elements or any kind of combination thereof. Furthermore, the devices may be processors or may comprise processors, wherein the functions of the elements, units and means described in the present applications may be implemented in one or more processors. All steps which are performed by the various entities described in the present application as well as the functionality described to be performed by the various entities are intended to mean that the respective entity is adapted to or configured to perform the respective steps and functionalities. Even if in the following description or specific embodiments, a specific functionality or step to be performed by a general entity is not reflected in the description of a specific detailed element of that entity which performs that specific step or functionality, it should be clear for a skilled person that these methods and functionalities can be implemented in respect of software or hardware elements, or any kind of combination thereof.

BRIEF DESCRIPTION OF DRAWINGS

The present disclosure is in the following explained in detail in relation to embodiments of the disclosure in reference to the enclosed drawings, in which.

DESCRIPTION OF EMBODIMENTS

First, the underlying problem and exemplary filter structures and filter circuits have been described along FIG. 1-FIG. 6. In the following, along FIG. 7, a general construction of a filter circuit according to the first aspect of the disclosure is described. Along FIG. 8-FIG. 14, different embodiments of the filter circuit of the first aspect of the disclosure are shown. Similar entities and reference numbers in different figures have been partially omitted.

Figure 1:
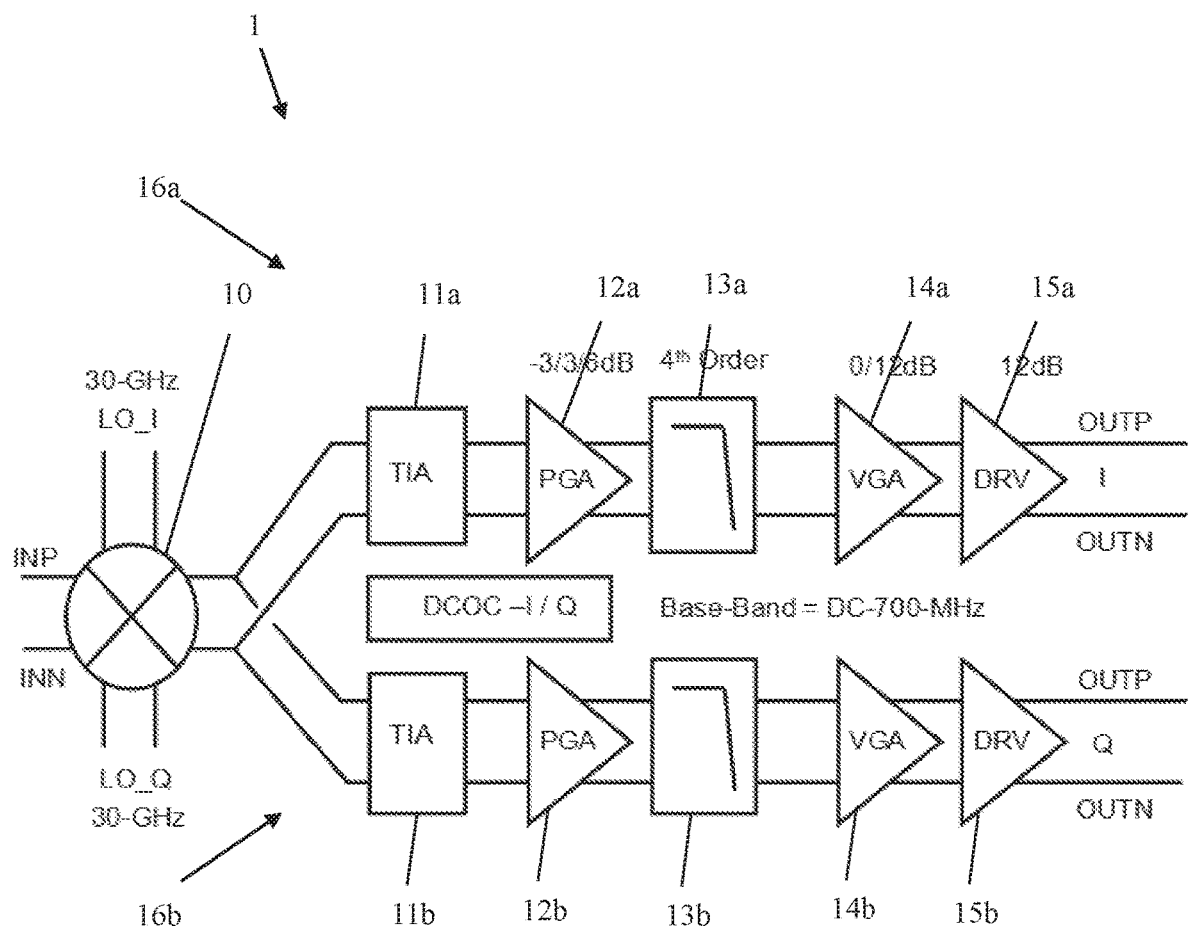
FIG. 1 shows an exemplary receiver structure.
Figure 2:
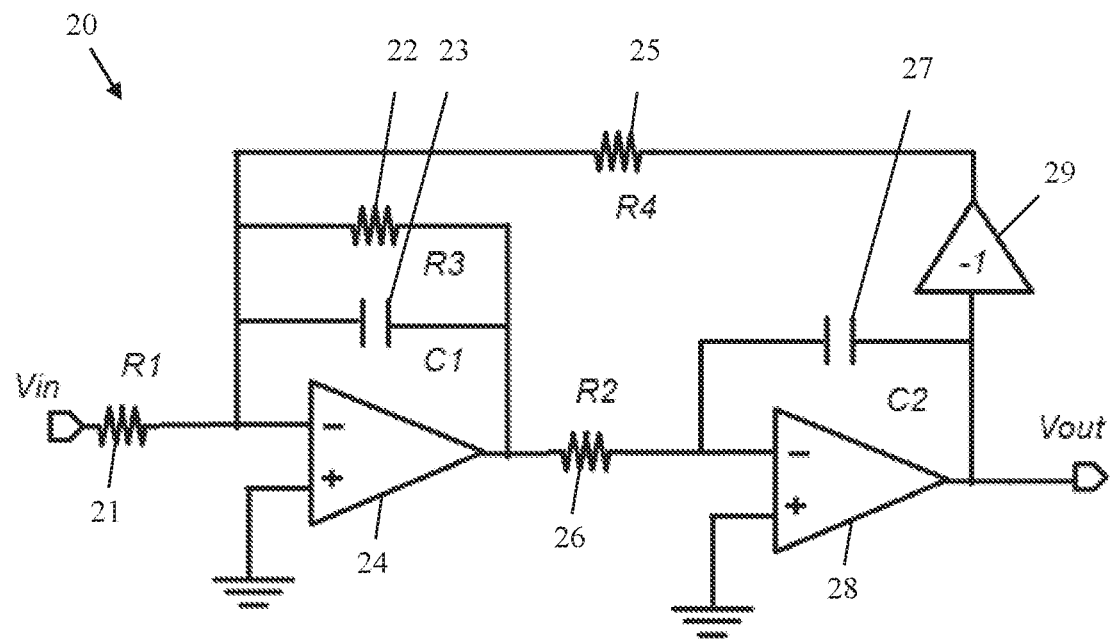
FIG. 2 shows a first exemplary filter structure—a BiQuad Structure.
Figure 3:
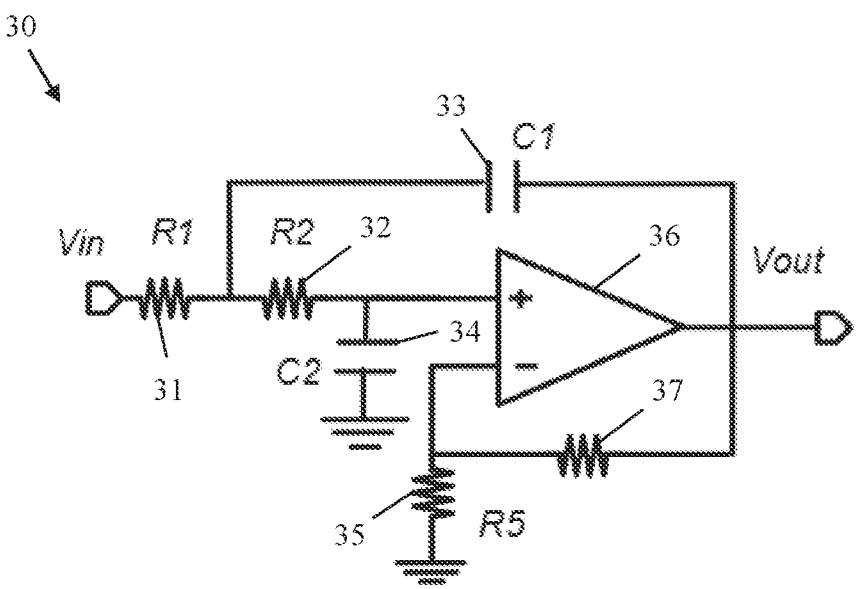
FIG. 3 shows a second exemplary filter structure—a Sallen-Key Structure.
Figure 4:
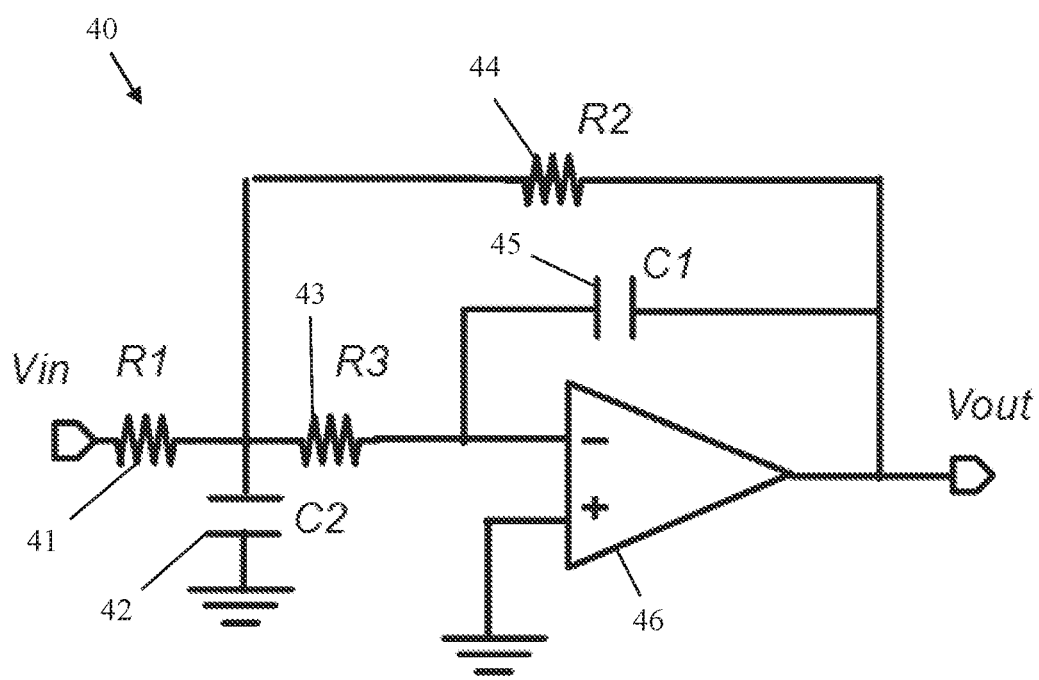
FIG. 4 shows a third exemplary filter structure—an MFB Structure.
Figure 5:
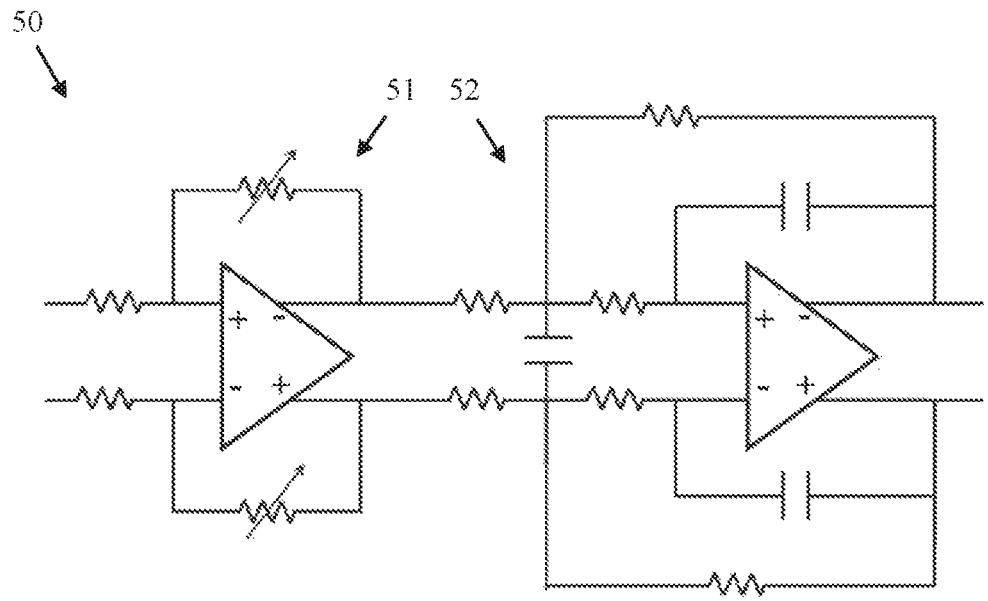
FIG. 5 shows a first exemplary filter circuit.
Figure 6:
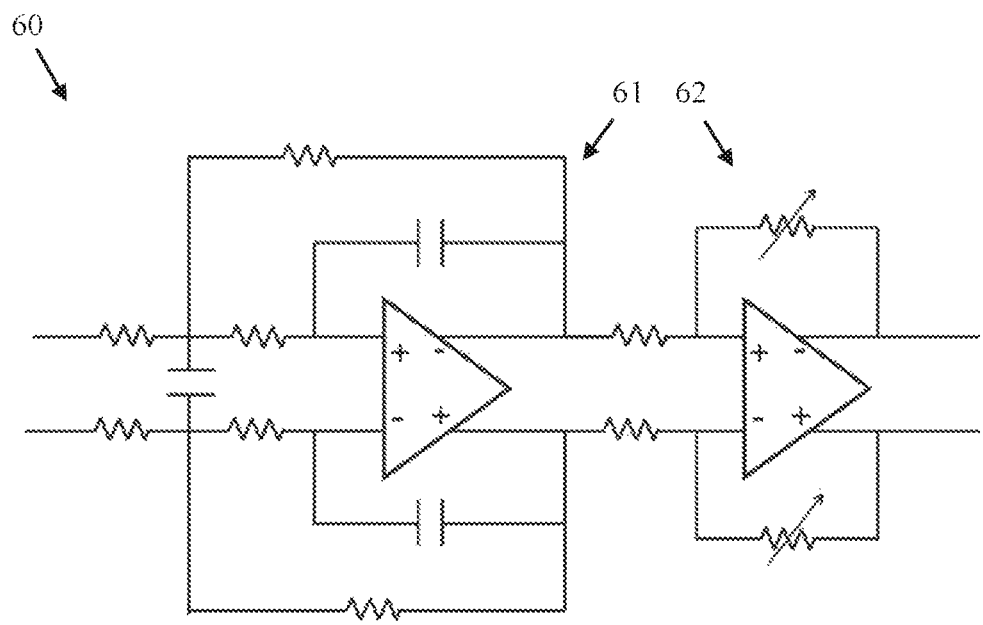
FIG. 6 shows a second exemplary filter circuit.
Figure 7:
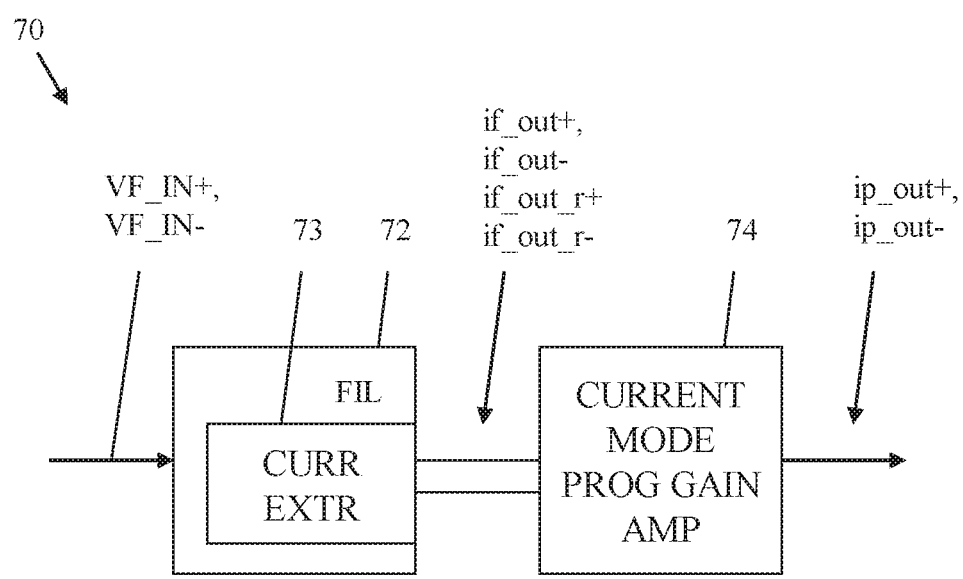
FIG. 7 shows a first embodiment of the filter circuit according to the first aspect of the disclosure.

In FIG. 7, a filter circuit 70 according to the first aspect of the disclosure is shown. The filter circuit 70 comprises a filter 72 and a current mode programmable gain amplifier 74. The filter 72 is connected to the current mode programmable gain amplifier 74. The filter 72 moreover comprises a current extraction element 73.

An input signal VF_IN+, VF_IN− is provided to the filter circuit 70, especially to the filter 72. A filtering of the input signal 71 is performed by the filter 72. The current extraction element 73 extracts a first output current if_out+, if_out− and a second output current if_out_r+, if_out_r− from the filter 72 and provides it to the current mode programmable gain amplifier 74. It receives and amplifies the first output current signal if_out+, if_out− resulting in an amplified current signal ip_out+, ip_out−.

Figure 8:
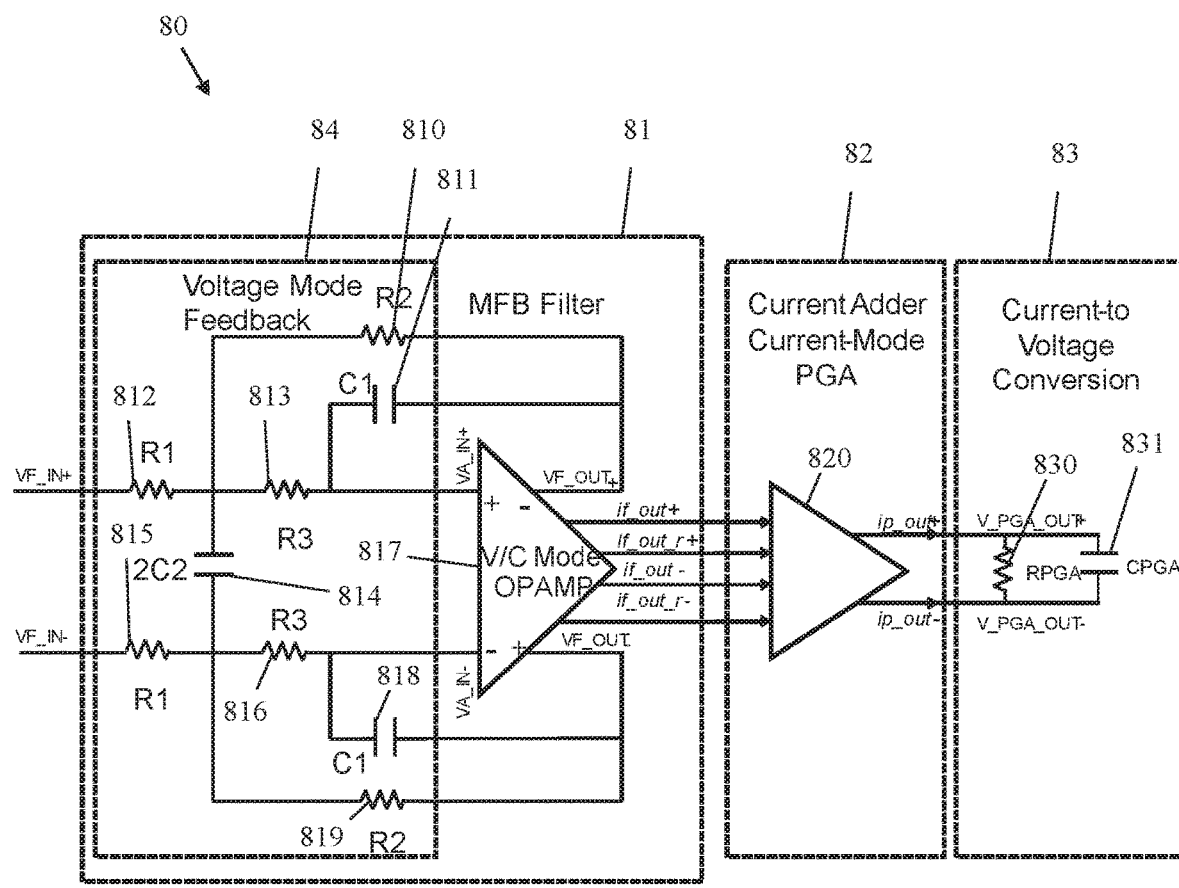
FIG. 8 shows a second embodiment of the filter circuit according to the first aspect of the disclosure.

In FIG. 8, a more detailed second embodiment of the filter circuit 80 according to the first aspect of the disclosure is shown. The filter circuit 80 again comprises a filter 81 and a current mode programmable gain amplifier 82, which are connected to each other. Moreover, the filter circuit 80 here comprises a current-to-voltage converter 83, which is connected to the current mode programmable gain amplifier 82.

Especially, the filter 81 comprises a voltage mode feedback unit 84, which comprises resistors 812, 815, which are connected to input terminals of the filter circuit 80. Connected in series to the resistors 812, 815, are resistors 813, 816, which are further connected to a positive and a negative input of an operational amplifier 817. A negative output of the operational amplifier 817 is moreover connected by a capacitor 811 to the positive input of the operational amplifier 817 and by a resistor 810 to the resistor 812. A positive output of the operational amplifier 817 is connected to the negative input of the operational amplifier 817 by a capacitor 818 and by a resistor 819 to the resistor 815. Moreover, a capacitor 814 connects the resistor 812 to the resistor 815. The resistors 810, 812, 813, 815, 816 and 819, the capacities 811, 814 and 818 form the voltage mode feedback unit 84.

The operational amplifier 817 comprises a number of outputs for extracting current from the filter 81. Especially, four signals if_out+, if_out_r+, if_out—, if_out_r– are provided to the current mode programmable gain amplifier 82, which performs an amplification and thereby produces an output signal ip_out+, ip_out–, which is a current signal. This current signal is provided to the current-to-voltage converter 83, which comprises a resistor 830 connected in parallel to a capacitor 831. The current-to-voltage converter 83 converts the output signal ip_out+, ip_out– into an output voltage signal V_PGA_OUT+, V_PGA_OUT.

Figure 9:
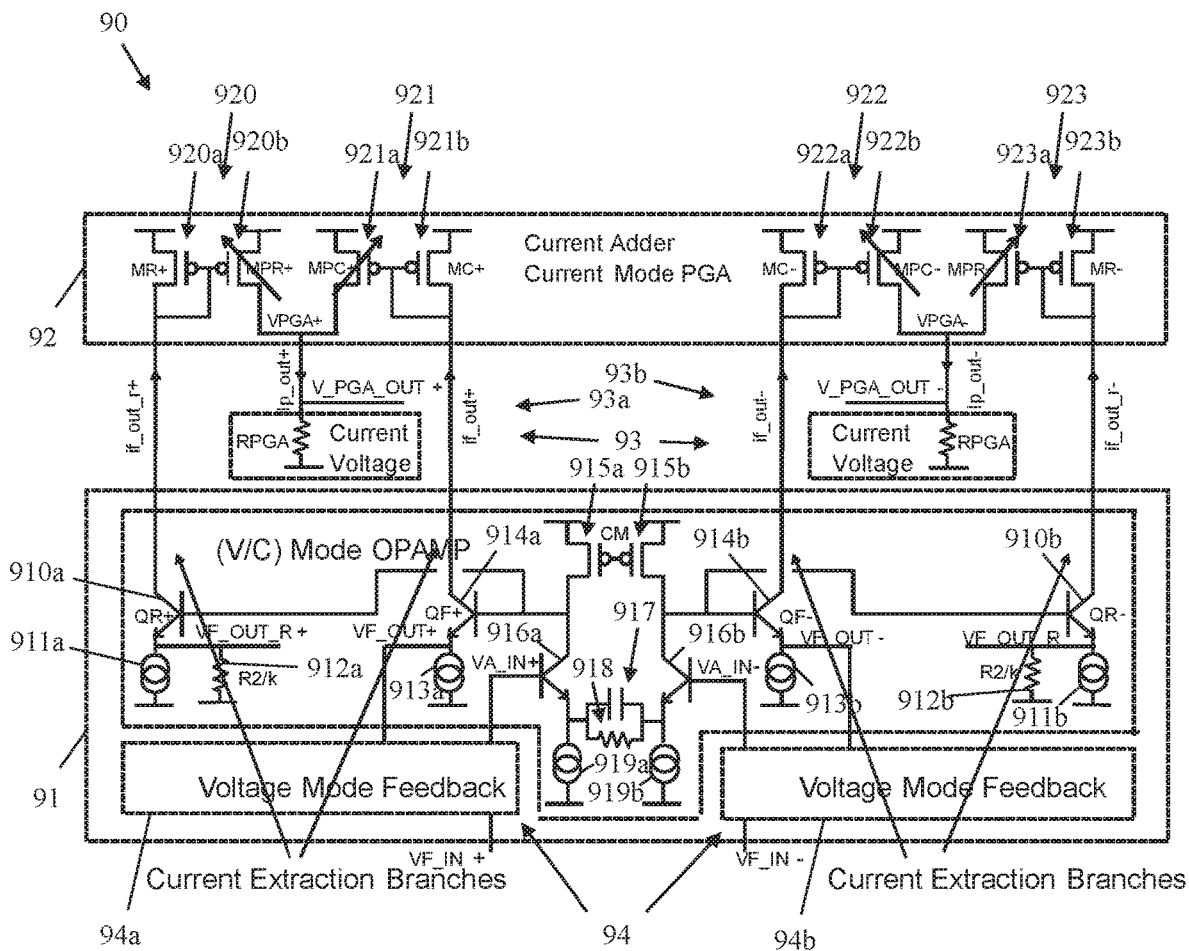
FIG. 9 shows a third embodiment of the filter circuit according to the first aspect of the disclosure.

In FIG. 9, a more detailed embodiment of the filter circuit 90 according to the first aspect of the disclosure is shown. The filter circuit 90 again comprises a filter 91 connected to a current mode programmable gain amplifier 92, which is connected to a current-to-voltage converter 93.

The filter 91 comprises a voltage mode feedback unit 94, which is separated into a first voltage mode feedback unit part 94a and a second voltage mode feedback unit part 94b. The voltage mode feedback unit 94 is constructed for example as depicted in FIG. 8. The filter 91 moreover comprises a transistor pair 916a, 916b, which is connected with its bases to the voltage mode feedback unit 94. The emitters of the transistor pair 916a, 916b are connected to current sources 919a, 919b, which in turn are connected to ground. The emitters are moreover connected to each other by a parallel connection of a capacitor 917 and a resistor 918. The collectors of the transistors 916a, 916b are connected to a field effect transistor pair 915a, 915b. The field effect transistors 915a, 915b moreover are connected to ground and interconnected with their gates. The transistor pairs 915a, 915b, 916a, 916b, the current sources 919a, 919b, the capacitor 917 and the resistor 918 put the operational amplifier 817 of FIG. 8 into practice.

Moreover, the filter 91 comprises a first current extraction element, which is formed by a transistor pair 914a, 914b and respective current sources 913a, 913b, connecting the emitters of the transistors 914a, 914b to ground. The emitters of the transistors 914a, 914b are moreover connected to the voltage mode feedback unit 94. In this embodiment, the filter 91 moreover comprises a second current extraction element, comprised of a further transistor pair 910a, 910b, which is connected by the respective emitters to current sources 911a, 911b connected in parallel to resistors 912a, 912b, which are respectively connected to ground.

While the voltage mode feedback unit 94 and the transistor pair 916a, 916b perform the regular filtering operation, the current extraction elements formed by the transistor pairs 914a, 914b and 910a, 910b extract the output signals if_out_r+, if_out+, if_out–, if_out_r– without influencing the filtering. This is done by the current extraction elements producing the output signals as a current mirror of the current through the filter. By this mirror operation, the current through the filter is not influenced. The respective output currents if_out_r+, if_out+, if_out–, if_out_r– are provided to the current mode programmable gain amplifier 92, which performs a respective amplification. Especially the current mode programmable gain amplifier 92 comprises a differential field effect transistor pair 920, 921, 922, 923 for each of the output signals if_out_r+, if_out+, if_out–, if_out_r–. Especially, the transistor pair 920 comprises a first transistor 920a and a second transistor 920b. The first transistor 920a is diode-connected. The gate of the first transistor 920a is connected to the gate of the second transistor 920b. The sources of the transistors 920a, 920b are connected to ground. The signal if_out_r+ is connected to the drain of the transistor 920a. The amplification by the second transistor 920b is controllable. The drain of the second transistor 920b is connected to the current-to-voltage converter 93.

The second transistor pair 921 comprises a first transistor 921a and a second transistor 921b. The sources of the transistors 921a, 921b are connected to ground. The gates of the transistors 921a, 921b are connected to each other. The transistor 921b is diode-connected. The drain of the transistor 921b is connected to the signal if_out+. The drain of the transistor 921a is connected to the current-to-voltage converter 93.

The transistor pair 922 comprises a first transistor 922a and a second transistor 922b and is constructed and connected in a similar manner to the transistor pair 921. The transistor pair 922 is provided with the output signal if_out– and also connected to the current-to-voltage converter 93. The transistor pair 923 comprises a first transistor 923a and a second transistor 923b and is constructed and connected in a similar manner as the transistor pair 920. The transistor pair 923 is provided with the output signal if_out_r– and connected to the current-to-voltage converter 93.

The output signals ip_out+ and ip_out–, which are generated by the current mode programmable gain amplifier 92 are handed to the current-to-voltage converter 93, which performs a current-to-voltage conversion thereby generating the voltage mode output signals v_pga_out+, v_pga_out– at respective output terminals.

Regarding the function of the circuit shown in FIG. 9, the following aspects should be highlighted.

In the filter 91, a closed loop structure, for example a MFB Filter, uses a Voltage/Current (V/C) Mode OPAMP 817, the feedback loop relates to voltage quantities (VF_OUT, VA_IN, VF_IN), current mode to the 4 generated currents, if_out, if_out_r, positive and negative.

The OPAMP 817 generates 4 different currents, if_out, if_out_r, positive and negative, that are a function of the input voltage VF_IN and. Filter parameters. The currents are generated using the transistor pairs 920, 921, 922, 923.

if_out (positive and negative) currents are an image of the current provided by the OPAMP 817 when operated in voltage-feedback. In the case of MFB, transfer function TF(if_out/VF_OUT) has a zero $\omega z$ whose position is a function of MFB Filter parameters.

QR and QF voltage followers, which are also referred to as transistors 910a, 910b, 914a, 914b, are identical and have their respective base connected together, therefore VF_OUT_R is an exact replica of VF_OUT and the current if_out_r=k*VOUT/R2. Because of that TF(f_out_r/VT=k*(1/R2)*TF(VF_OUT/VF_IN).

The 4 currents if_out (positive and negative) and if_out_r (positive and negative) are added and processed by the current-mode PGA 92. Current Gain is achieved by programmable transistors MPR, MPC, also referred to as 920b, 921a, 922b, 923a. Current-mode operation allows the maximum bandwidth to be increased vs. a voltage mode approach and it is more suitable for low supply advanced Complementary metal-oxide-semiconductor (CMOS) technologies.

The addition of if_out and if_out_r results into ip_out and the transfer function TF(ip_out/VF_IN) has a zero ωzn located into a position that is a function of k and MFB Filter parameters.

PGA output currents ip_out are transformed in a voltage by the current-voltage converter 93, in this case, a simple resistor. The parasitic capacitor associated to current-voltage conversion introduces a pole ωp in the transfer function TF(V_PGA_OUT/ip_out).

With proper choice of MFB Filter parameters, ωp=ωzn such that a pole-zero cancellation can be performed to extend MFB/PGA bandwidth of the TF(V_OUT_PGANF_IN).

In order to further explain proposed approach, some of the above points are expanded below.

Figure 10:
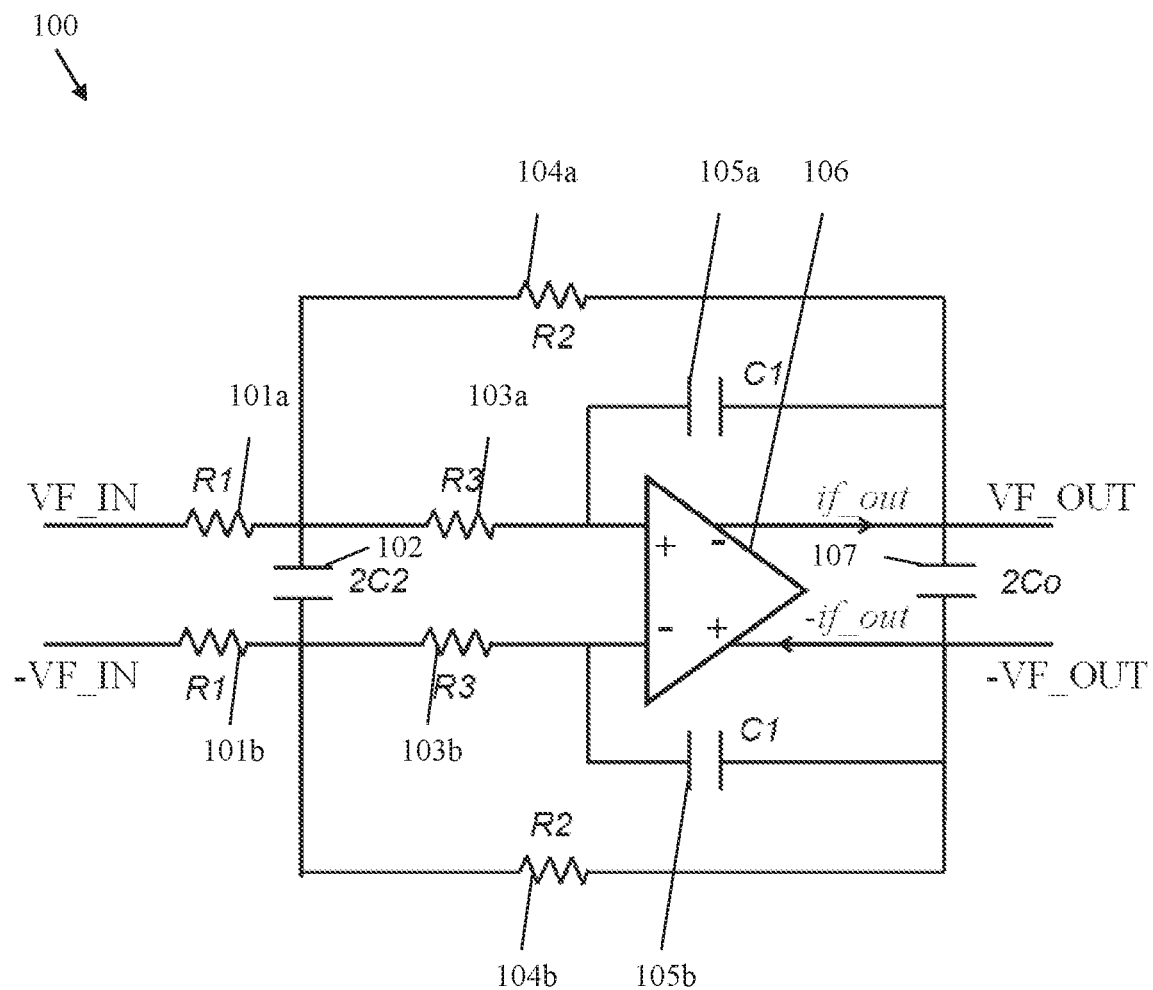
FIG. 10 shows a detail of a fourth embodiment of the filter circuit according to the first aspect of the disclosure.

With reference to a MFB Filter depicted in FIG. 10, the following equations show that the if_out (positive and negative) are an image of VF_OUT with the addition of a zero, whose location depends on MFB Filter parameters and the load capacitor. In FIG. 10 an MFB filter 100 is shown, The MFB filter 100 corresponds to the voltage mode feedback unit 94 and the transistor pairs 915a, 915b, 916a, 916b, the capacitor 917 and the resistor 918 and the current sources 919a, 919b of FIG. 9.

The filter 100 comprises resistors 101a, 101b, which are connected to input ports of the filter 100. Connected in series are resistors 103a, 103b, which connect to a positive and a negative input of the operational amplifier 106. A negative output of the operational amplifier 106 is connected to the positive input of the operational amplifier 106 by a capacitor 105a and to the resistor 101a by a resistor 104a. A positive output of the operational amplifier 106 is connected to the negative input of the operational amplifier 106 by a capacitor 105b and to the resistor 101b by a resistor 104b. The resistors 101a and 101b are connected by a further capacitor 102. The positive and negative outputs of the operational amplifier are moreover connected by a capacitor 107. The input signal VF_IN and −VF_IN are provided to the resistors 101a, 101b. The output signals VF_OUT and −VF_OUT are provided at the output ports of the operational amplifier 106. The Transfer function, the operating frequency and the quality factor are given by:

$$H(s) = \frac{V_{F\_OUT}}{V_{F\_IN}} = \frac{-R_2/R_1}{1 + s/(Q\omega_o) + (s/\omega_o)^2},$$

$$Q = \sqrt{\frac{C_2}{C_1}} \cdot \frac{\sqrt{R_2 R_3}}{R_2 + R_3\left(1 + \frac{R_2}{R_1}\right)},$$

$$\omega_o = \frac{1}{\sqrt{C_1 C_2 R_3 R_1}},$$

$$i_{f\_out} = \frac{V_{F\_OUT}}{R_2}\left(1 + \frac{s}{\omega_z}\right),$$

$$\omega_z = \frac{1}{C_1(R_2 + R_3) + R_2 C_0}, \text{ and}$$

$$\frac{i_{f\_out}}{V_{F\_IN}} = \frac{H(s)}{R_2} \cdot \left(1 + \frac{s}{\omega_z}\right).$$

The current Gain is achieved by programmable transistors MPR, MPC, also referred to as 920b, 921a, 922b, 923a. This can be implemented as depicted in FIG. 11, and FIG. 12.

Figure 11:
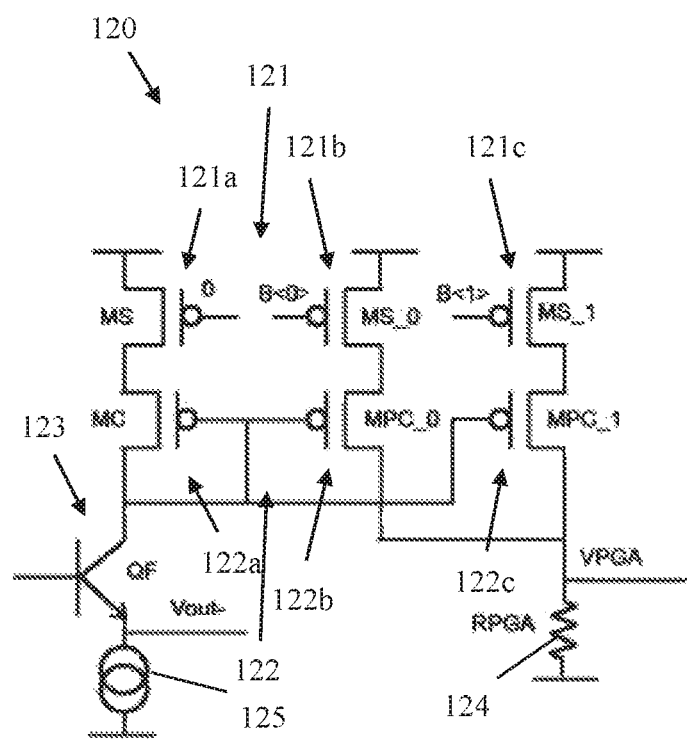
FIG. 11 shows a detail of a fifth embodiment of the filter circuit according to the first aspect of the disclosure.
Figure 12:
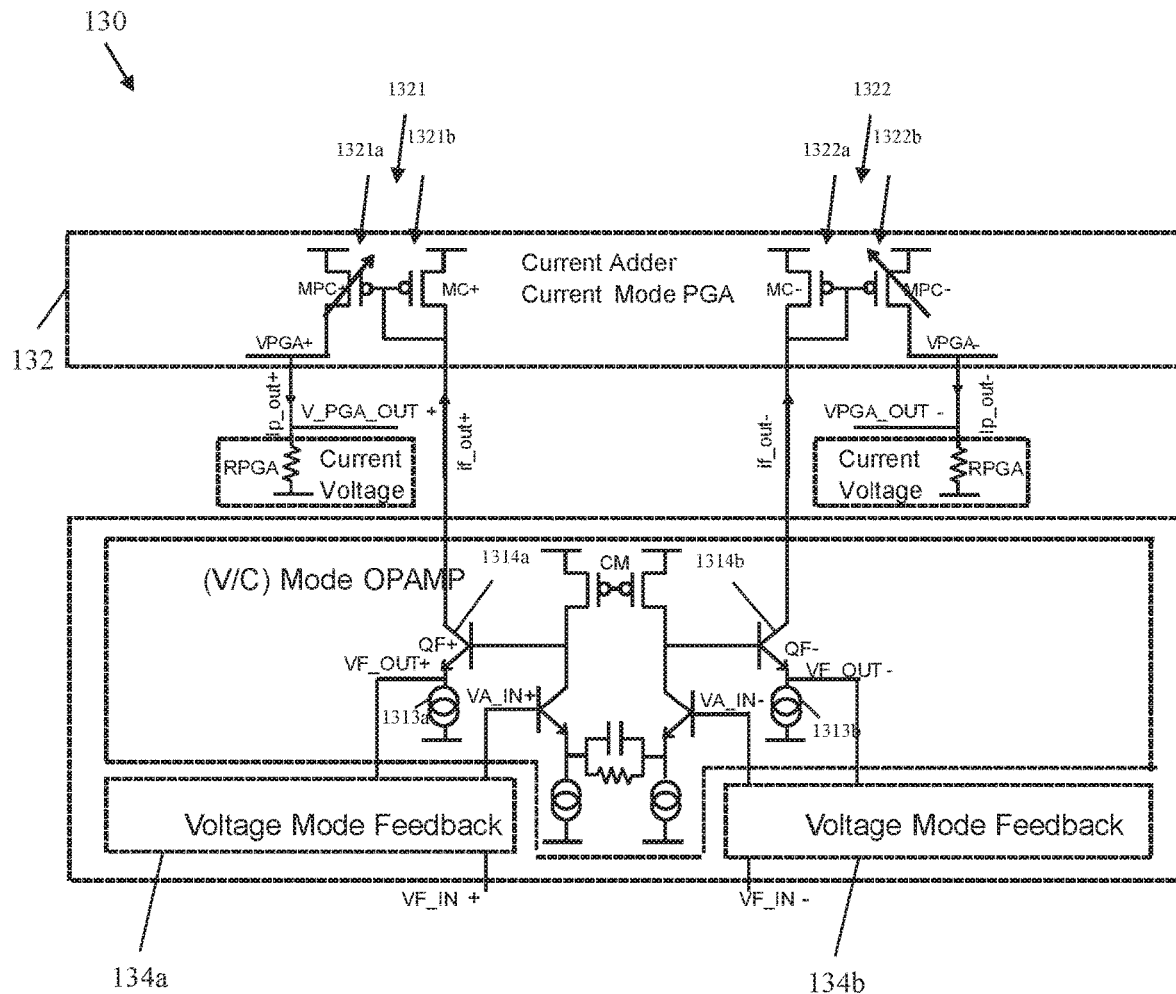
FIG. 12 shows a detail of a sixth embodiment of the filter circuit according to the first aspect of the disclosure.

In FIG. 11, a detailed implementation of the current mode programmable gain amplifier 120 corresponding to the current mode programmable gain amplifier 74 of FIG. 7 or 82 of FIG. 8 or 92 of FIG. 9 is shown. The current mode programmable gain amplifier 120 comprises a transistor 123 connected with its emitter to a current source 125. The collector of the transistor 123 is connected to a drain of a transistor 122a of a field effect transistor pair 122 consisting of the first transistor 122a and a second transistor 122b, which are connected to each other with their gates. The transistor 122a moreover is diode-connected. The sources of the transistors 122a, 122b are connected to drains of transistors 121a, 121b of a second field effect transistor pair 121. The sources of these transistors 121a, 121b are connected to ground. The gate of the transistor 121a is connected to a ground, while the gate of the transistor 121b is connected to either ground or a supply voltage. Moreover, the current mode programmable gain amplifier 120 further comprises a field effect transistor 121c, which is connected with its source to ground and with its drain to the source of a field effect transistor 122c, which is connected with its drain to the drain of the field effect transistor 122b and to a resistor 124, which again is connected to ground. The gate of the transistor 121c is connected to either ground or the supply voltage. The gate of the transistor 122c is connected to the collector of the transistor 123. The emitter of the transistor 123 forms the input of the current mode programmable gain amplifier 120, while the drain of the transistor 122c and 122b form the output.

The current Gain is achieved by means of a current steering technique. The gates of the transistors 121a, 121b can set to 0 (GND) or 1 (VDD) to increase or reduce the current delivered to the load resistor 124.

Further, if_out and if_out_r are summed together and amplified as follows:

$$i_{f\_out\_r} = \frac{V_{OUT}}{R_2} k,$$

$$i_{f\_out} = \frac{V_{out}}{R_2}\left(1 + \frac{s}{\omega_z}\right), \text{ and}$$

$$i_{p\_out} = G_{PGA}(i_{f\_out} + i_{f\_out\_r}) = G_{PGA} \cdot \frac{V_{OUT}}{R_2}(1+k)\cdot\left(1 + \frac{s}{\omega_{zm}}\right).$$

The resulting current I_PGA can be re-written as follows:

$$i_{p\_out} = G_{PGA} \cdot \frac{V_{OUT}}{R_2}(1+k)\cdot\left(1 + \frac{s}{\omega_{zm}}\right), \text{ and}$$

$$\omega_{zm} = (1+k)\cdot\omega_z = \frac{1+k}{C_1(R_2+R_3) + R_2 C_0}.$$

This means that the location of the zero in the transfer function TF(ip_out/VF_IN) can be moved at higher frequency if K>0, moved at lower frequencies with K<0.

The current-to-voltage conversion introduces a pole ωPGA that depends on the product RPGA*CPGA. For example:

$$V_{PGA\_OUT} = i_{p\_out} \cdot R_{PGA} \cdot \left(\frac{1}{1 + s \cdot \omega_{PGA}}\right), \text{ therefore}$$

-continued $$V_{PGA\_OUT} = R_{PGA} \cdot \left(\frac{1}{1+s \cdot \omega_{PGA}}\right) \cdot G_{PGA} \cdot V_{F\_IN} \cdot H(s) \cdot \left(\frac{1+k}{R_2}\right)(1+s \cdot \omega_{zm}).$$

By proper choice of K, location of ωzm zero can be made equal to ωPGA in order to have that:

$$V_{PGA\_OUT} =$$
$$R_{PGA} \cdot \left(\frac{1}{1+s \cdot \omega_{PGA}}\right) \cdot G_{PGA} \cdot V_{F\_IN} \cdot H(s) \cdot \left(\frac{1+k}{R_2}\right)(1+s \cdot \omega_{zm}) =$$
$$V_{F\_IN} \cdot H(s) \cdot (1+k) \cdot \frac{R_{PGA}}{R_2} \cdot G_{PGA}.$$

So the parasitic pole associate to current-to-voltage conversion is cancelled out and the total transfer function of the current-mode PGA will reproduce exactly the. Filter response shape, with a voltage gain function of ratio of resistor, k and the gain of the PGA:

$$\frac{V_{PGA\_OUT}}{V_{F\_IN}} = H(s) \cdot (1+k) \cdot \frac{R_{PGA}}{R_2} \cdot G_{PGA}.$$

The proposed approach as explained in the embodiments described above has the following advantages. Overcome the limitation of MFB of not being able to simultaneously tune frequency and gain. embed a current mode PGA into a Filter avoid the use of a separated closed loop PGA with an additional OPAMP implementation is based on a stacked circuit that is re-using Filter direct current (DC) (current implementation is a diode) the stacked circuit extracts currents if_out and if_out_r and uses them in a current mode PGA. Given the current mode approach, the approach can give extremely large bandwidths and allows to avoid a separated voltage-mode PGA with its associated bandwidth limitations the bandwidth limitation will be given by the current-to-voltage conversion, with an associated pole. This pole can be canceled out by the parasitic zero associated to current extraction.

For specific cases, the circuit complexity can be reduced. One of these cases is that the filter quality factor Q>1 and the zero ωz is in the location desired to cancel the parasitic pole ωp. In this case, there is no need to use an auxiliary path i_out_r to alter the location of the zero in the ip_out current, where the implementation can be reduced as a circuit 130 shown in FIG. 12.

There, it can clearly be seen that only a single current extraction element formed by the transistors 1314a, 1314b and the current sources 1313a and 1313b is present. Also, the current mode programmable gain amplifier 132 only comprises two transistor pairs 1321 and 1322, consisting of transistors 1321a, 1321b, 1322a, 1322b configured as shown in FIG. 12.

Figure 13:
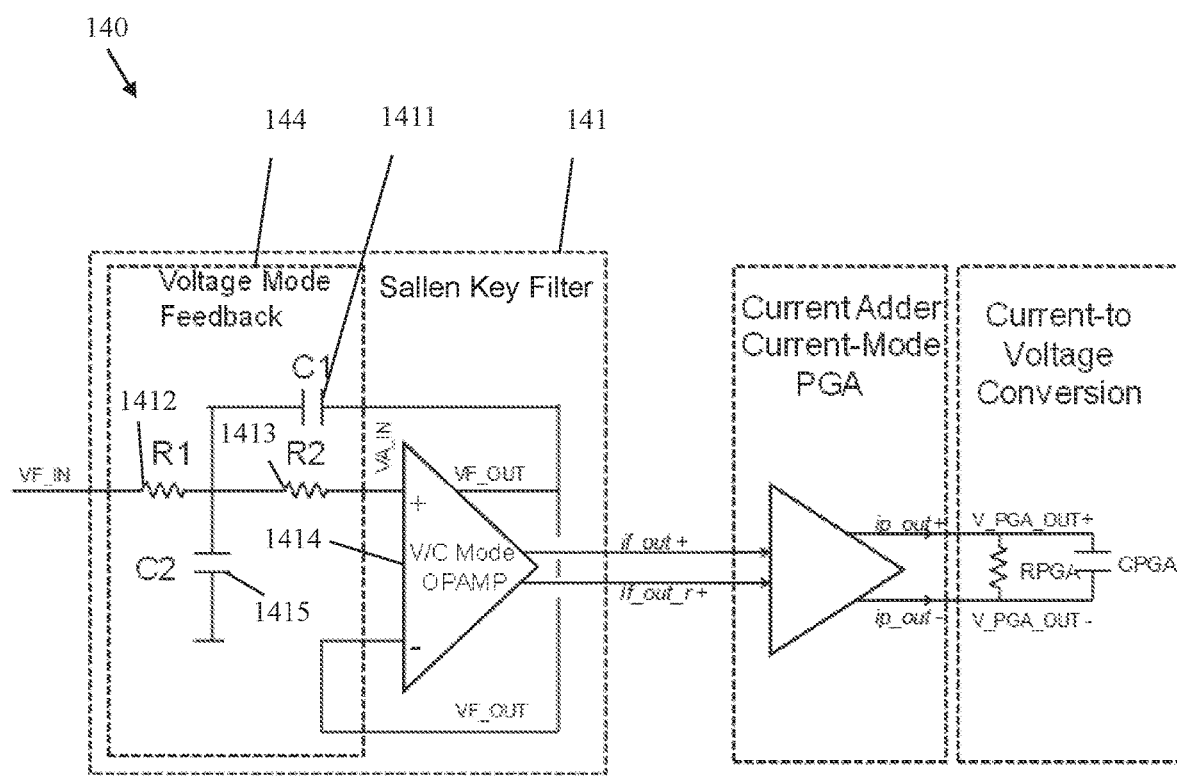
FIG. 13 shows a seventh embodiment of the filter circuit of the first aspect of the disclosure.

Moreover, instead of using an MFB filter, as shown in FIG. 8, also the use of a Sallen-Key filter, as shown in FIG. 13 is possible. In this case, the filter circuit 140 comprises a Sallen-Key filter 141, which comprises a voltage mode feedback unit 144. The input voltage vf_in is provided to a resistor 1412, which is series-connected to a further resistor 1413, which is connected to a positive input of the operational amplifier 1414. The output of the operational amplifier 1414 is connected to the first resistor 1412 via a capacitor 1411 and to the negative input of the operational amplifier 1414. Moreover, the resistor 1412 is connected to ground by a second capacitor 1415. Also, in this case, the use of only a single current extraction element resulting in the output signals if_out+ and if_out_r+ is shown.

The disclosure is not limited to the examples. The characteristics of the exemplary embodiments can be used in any advantageous combination.

The disclosure has been described in conjunction with various embodiments herein. However, other variations to the disclosed embodiments can be understood and effected by those skilled in the art in practicing the claimed disclosure, from a study of the drawings, the disclosure and the appended claims. In the claims, the word "comprising" does not exclude other elements or steps and the indefinite article "a" or "an" does not exclude a plurality. A single processor or other unit may fulfill the functions of several items recited in the claims. The mere fact that certain measures are recited in usually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the internet or other wired or wireless communication systems,

The invention claimed is:

1. A filter circuit for filtering an input signal, wherein the filter circuit comprises:
   a filter configured to receive the input signal, wherein the filter comprises:
      a first current extraction circuit comprising a first current extraction transistor comprising a first base, wherein the first current extraction circuit is configured to extract a first output current signal from the input signal; and
      a second current extraction circuit comprising a second current extraction transistor and a resistive element, wherein the second current extraction transistor comprises a second base and an emitter, wherein the first base is coupled to the second base, and wherein the emitter is coupled to the resistive element; and
   a current mode programmable gain amplifier coupled to the filter and configured to:
      receive the first output current signal;
      amplify the first output current signal to obtain an amplified current signal; and
      derive an output signal from the amplified current signal.

2. The filter circuit of claim 1, wherein the filter circuit is configured to perform filtering of the input signal with an adjustable frequency response, and wherein the filter further comprises at least one adjustable component configured to adjust the adjustable frequency response of the filter circuit.

3. The filter circuit of claim 1, wherein the filter circuit is configured to filter the input signal with an adjustable gain, and wherein the current mode programmable gain amplifier comprises at least one adjustable component configured to adjust the adjustable gain of the filter circuit.

4. The filter circuit of claim 1, further comprising a current-to-voltage-converter coupled to the current mode programmable gain amplifier and configured to convert the amplified current signal into the output signal, and wherein the output signal is a voltage mode signal.

5. The filter circuit of claim 1, wherein the first output current signal is a function of an output voltage signal of the filter.

6. The filter circuit of claim 1, wherein the second current extraction circuit is configured to generate a second output current signal, and wherein the second output current signal is proportional to an output voltage signal of the filter.

7. The filter circuit of claim 6, wherein the current mode programmable gain amplifier is further configured to receive the second output current signal, and wherein the current mode programmable gain amplifier further comprises:
- a first current mirror element configured to generate a first mirror output current of the first output current signal, wherein a first amplitude of the first mirror output current is programmable; and
- a second current mirror element configured to generate a second mirror output current of the second output current signal, wherein a second amplitude of the second mirror output current is programmable.

8. The filter circuit of claim 6, wherein the second current extraction circuit is configured to set a proportionality constant between a zero and a parasitic pole in a transfer function such that the zero is equal to the parasitic pole, wherein the transfer function comprises a ratio of the output signal to the input signal.

9. The filter circuit of claim 8, wherein a value of the resistive element is configured to set the proportionality constant.

10. The filter circuit of claim 1, wherein the input signal is a first differential signal, wherein the first output current signal is a second differential signal, wherein the first current extraction transistor and the second current extraction transistor form a differential current extraction pair that is configured to extract the first output current signal from the filter, wherein the amplified current signal is a third differential signal, and wherein the output signal is a fourth differential signal.

11. The filter circuit of claim 7, wherein the first current mirror element is a first controllable differential transistor pair, and wherein the second current mirror element is a second controllable differential transistor pair.

12. The filter circuit of claim 7, wherein the first current mirror element is a first controllable differential transistor pair, wherein the second current mirror element is a second controllable differential transistor pair, and wherein the first controllable differential transistor pair and the second controllable differential transistor pair are controllable to adjust a gain of the filter circuit.

13. The filter circuit of claim 7, wherein the first current mirror element is a first controllable differential transistor pair, wherein the second current mirror element is a second controllable differential transistor pair, and wherein the first controllable differential transistor pair and the second controllable differential transistor pair are configured to generate the amplified current signal.

14. The filter circuit of claim 4, wherein the current-to-voltage-converter comprises at least one resistor configured to convert the amplified current signal into the output signal.

15. The filter circuit of claim 4, wherein the amplified current signal and the output signal are differential signals, wherein the current-to-voltage-converter comprises a first resistor and a second resistor, wherein each of the first resistor and the second resistor is grounded, wherein a respective differential component signal of the amplified current signal is inputted into a respective one of the first resistor and the second resistor, and wherein each of the first resistor and the second resistor is configured to convert a respective component of the amplified current signal into a corresponding component of the output signal.

16. The filter circuit of claim 1, wherein the filter is configured as a Sallen-Key Filter.

17. The filter circuit of claim 1, wherein the filter comprises a feedback circuit such that the filter is configured as a Multiple Feedback Filter.

18. The filter circuit of claim 7, wherein the current mode programmable gain amplifier is further configured to add the first mirror output current and the second mirror output current to generate the amplified current signal.

19. The filter circuit of claim 11, wherein the first controllable differential transistor pair and the second controllable differential transistor pair are controllable to adjust a gain of the filter circuit, and wherein the first controllable differential transistor pair and the second controllable differential transistor pair are configured to generate the amplified current signal.

20. The filter circuit of claim 1, wherein the resistive element is coupled in parallel to a current source.

* * * * *